(12) United States Patent
Chen et al.

(10) Patent No.: US 8,272,767 B2
(45) Date of Patent: Sep. 25, 2012

(54) LED MODULE

(75) Inventors: Chin-Chung Chen, Taipei Hsien (TW); Hai-Wei Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 564 days.

(21) Appl. No.: 12/608,973

(22) Filed: Oct. 29, 2009

(65) Prior Publication Data
US 2011/0075428 A1    Mar. 31, 2011

(51) Int. Cl.
*F21V 3/00* (2006.01)
(52) U.S. Cl. .............. 362/311.02; 362/311.01; 362/326; 362/335; 359/642; 359/727
(58) Field of Classification Search .................. 362/244, 362/311.01–311.02, 311.06, 311.09, 317, 362/326, 335, 800; 359/642, 727
See application file for complete search history.

(56) References Cited

U.S. PATENT DOCUMENTS
6,547,423 B2 *  4/2003  Marshall et al. .............. 362/333

\* cited by examiner

*Primary Examiner* — Meghan Dunwiddie
(74) *Attorney, Agent, or Firm* — Altis Law Group, Inc.

(57) ABSTRACT

An LED module includes an LED having a central axis I, and a lens. The lens has an incident face for incidence of the light of the LED and an opposite emitting face for refracting the light of the LED out of the lens. The emitting face of the lens has a central axis II. The central axis II is offset from the central axis I and located at one side of a plane ZOX of an XYZ coordinate with an original O which is located at a center of the LED, in which the central axis I is coincident with the Z axis. The light beams emitted from the one side of the plane ZOX are stronger than the light beams emitted from the another side of the plane ZOX after the light beams emitted from the LED pass through the lens.

14 Claims, 7 Drawing Sheets

LED MODULE

BACKGROUND

1. Technical Field

The present disclosure relates generally to LED modules, and more particularly to an LED module with an improved lens.

2. Description of Related Art

LED module, a solid-state lighting, utilizes LEDs as a source of illumination, providing advantages such as resistance to shock and nearly limitless lifetime under specific conditions. Thus, LED modules present a cost-effective yet high quality replacement for incandescent and fluorescent lamps.

Known implementations of LED modules in an LED module employ lenses for focusing light generated by the LEDs. However, a light pattern provided by such an LED module is substantially round, and is not suitable for illuminating a certain location, such as roadway, which has a need to be able to direct light in a middle of the roadway instead of lighting on a region neighboring a roadside of the roadway. Apparently, the round light pattern provided by the conventional LED module can not satisfy such a requirement.

Therefore, it is desirable to provide an LED module which can overcome the above described shortcoming.

DETAILED DESCRIPTION

FIGS. 1 to 4 illustrate an LED module 1 in accordance with an exemplary embodiment including an LED 10 and a lens 20 covering the LED 10.

Figure 1:
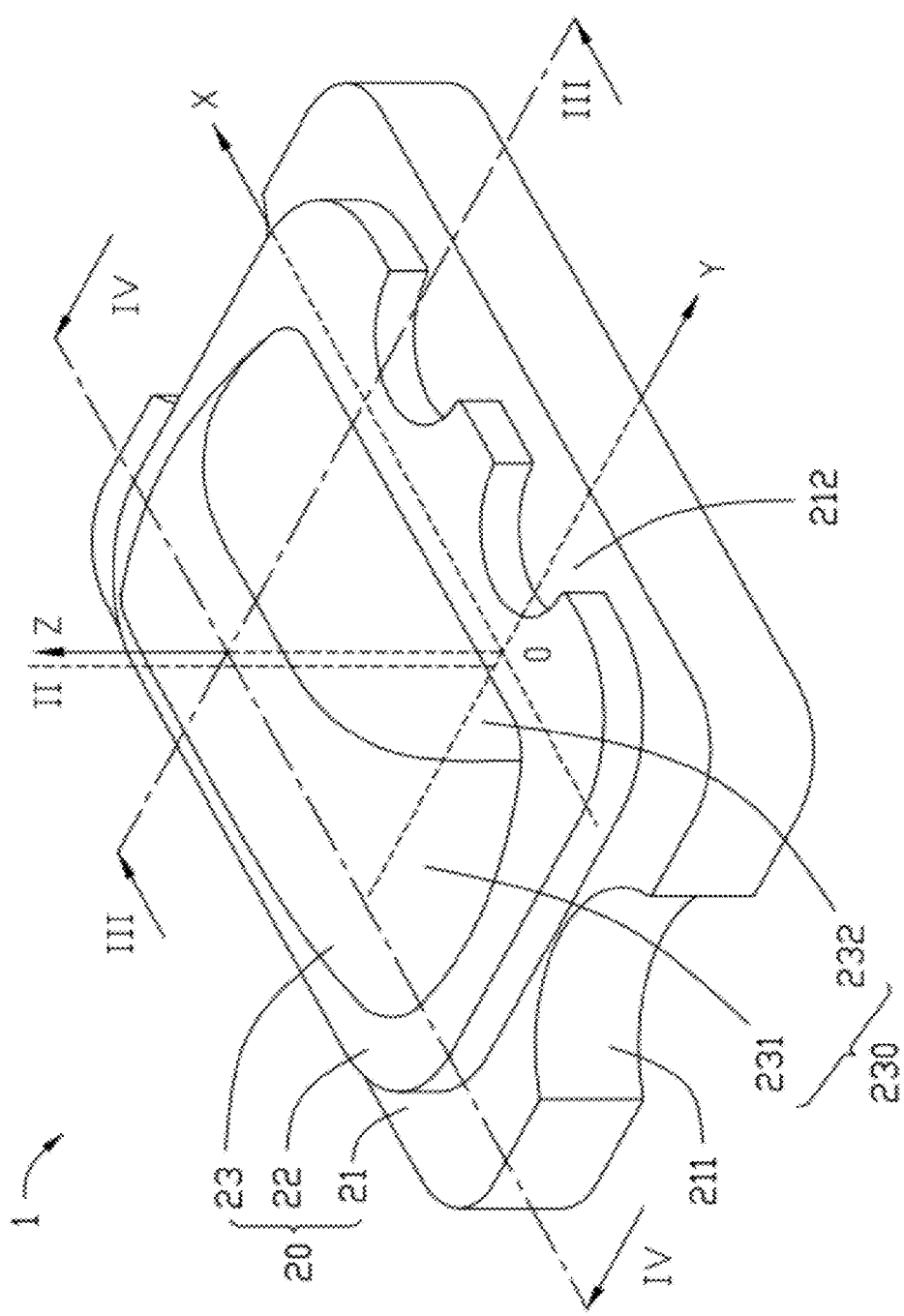
FIG. 1 is an isometric, assembled view of an LED module in accordance with an exemplary embodiment.
Figure 2:
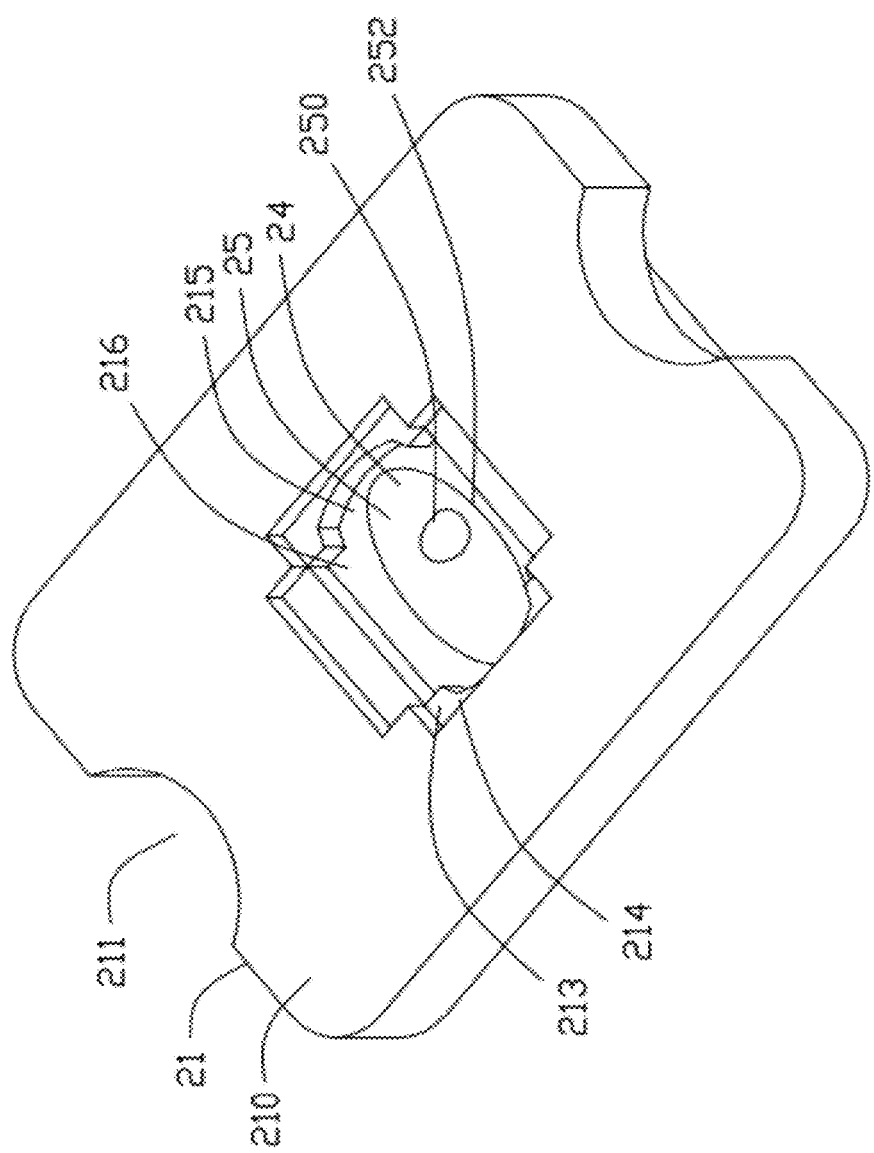
FIG. 2 is an inverted view of a lens of the LED module of FIG. 1.

A three dimensional coordinate system, with an origin O and axes X, Y and Z, as shown by the arrows in FIG. 1, is adopted to clearly describe the LED module 1. The origin O is located in a center of the LED. The X axis extends from the origin O along a front-to-rear direction of the LED module 1, the Y axis extends from the origin O along a left-to-right direction of the LED module 1, and the Z axis extends from the origin O along a bottom-to-top direction of the LED module 1. Any two of the three axes X, Y, Z are perpendicular to each other. The X axis and the Z axis cooperatively define a plane ZOX, the Y axis and the Z axis cooperatively defines a plane YOZ, and the X axis and the Y axis cooperatively define a plane XOY. The plane ZOX and the plane YOZ are perpendicularly intersected at the Z axis. The plane XOY is perpendicularly intersected with the plane ZOX at the X axis and perpendicularly intersected to the plane YOZ at the Y axis.

The LED 10 includes a rectangular substrate 11, an LED chip 12 and an encapsulation unit 13. A flange 14 extends outwardly from a bottom of the substrate 11 for mounting the substrate 11 to the lens 20. A recess 110 is defined in a top surface of the substrate 11. The LED chip 12 is received in and located at a center of the recess 110. The encapsulation unit 13 fills the recess 110 and thus fixes the LED chip 12 on the substrate 11. A top surface of the encapsulation unit 13 is substantially planar in profile and functions as a light emitting surface 134 of the LED 10. The top surface of the encapsulation unit 13 is coplanar with the top surface of the substrate 11. The LED 10 has a central axis I overlapped with the Z axis. A light emitting angle of the LED 10 is 120 degrees.

The lens 20 is made of a light-transparent material, such as poly(methyl methacrylate) (PMMA). The lens 20 is elongated in profile with long sides extending along the X axis and short sides extending along the Y axis. That is, the X axis corresponds to a lengthwise direction of the lens 20, the Y axis corresponds to a widthwise direction of the lens 20 and the Z axis corresponds to a height direction of the lens 20.

The lens 20 includes a supporting portion 21 at a bottom thereof, a light conductive portion 23 at a top thereof and a connecting portion 22 between the supporting portion 21 and the light conductive portion 23. The supporting portion 21 is substantially rectangular, and has two arced cutouts 211 respectively defined at two opposite short sides thereof.

The connecting portion 22 is formed on a top side of the supporting portion 21. The connecting portion 22 is substantially rectangular, and has a length and a width being smaller than a length and a width of the supporting portion 21, respectively. Each short side of the connecting portion 22 is tangential to a corresponding cutout 211 of the supporting portion 21. Two semi-circular apertures 212 are defined in a right long side of the connecting portion 22.

The light conductive portion 23 extends upwardly from a top side of the connecting portion 22. The light conductive portion 23 is located closer to a left long side of the connecting portion 22 than to the right long side of the connecting portion 22, thereby deflecting the light emitted from the LED 10 towards the left long side of the LED module 1. An outer surface of the light conductive portion 23 functions as a light emitting face 230 of the LED module 1 for refracting the light of the LED 10 out of the lens 20 when the light extends through the lens 20. The light emitting face 230 generally has a profile of being a convex surface.

The light emitting face 230 includes two elongated ellipsoid surfaces 232 inclinedly and respectively located at two long sides of the light conductive portion 23, and a combination curved surface 231 located between and connecting the two ellipsoid surfaces 232. A central axis II of the light emitting face 230 of the lens 20 extends through a center of the combination curved surface 231. The central axis II of the light emitting face 230 of the lens 20 is parallel to and offsets from the central axis I of the LED 10. The central axis II of the light emitting face 230 is located on the plane YOZ at a left side of the central axis I of the LED 10. That is, the light emitting face 230 is symmetrical relative to the plane YOZ along the lengthwise direction of the lens 20, and is symmetrical relative to a plane K along the widthwise direction of the lens 20, wherein the plane K extends through the central axis II and is parallel to the plane ZOX. The plane K is located at a left side of the plane ZOX.

The combination curved surface 231 extends along the lengthwise direction of the lens 20. The combination curved surface 231 is consisted of a planar top surface located at a middle portion thereof and two spheroidal surfaces respectively located at two ends of the planar top surface and connecting the planar top surface with a top surface of the connecting portion 22 of the lens 20.

The two ellipsoid surfaces 232 of the light emitting face 230 are the same as each other, and are arranged symmetrically at two lateral sides of the combination curved surface 231. The ellipsoid surfaces 232 connect the combination curved surface 231 with the top surface of the connecting portion 22 of the lens 20. Each ellipsoid surface 232 is inclined upwardly and inwardly from the top surface of the connecting portion 22 of the lens 20 towards the combination curved surface 231 along the bottom-to-top direction of the LED module 1. A bottom of each ellipsoid surface 232 is located near and parallel to a corresponding long side of the connecting portion 22. A width of each ellipsoid surface 232 increases gradually from two ends to a middle thereof in the lengthwise direction of the lens 20. A width of the combination curved surface 231 decreases gradually from two ends to a middle thereof in the lengthwise direction of the lens 20.

A bottom surface of the supporting portion 21 of the lens 20 defines a substantially crisscross-shaped first receiving groove 213 at a center thereof thereby forming a first positioning surface 214 in the first receiving groove 213. The first positioning surface 214 has a center on the Z axis. The first positioning surface 214 is further recessed towards the light emitting face 230 to define a substantially crisscross-shaped second receiving groove 215 at a center thereof thereby forming a second positioning surface 216 in the second receiving groove 215. The second positioning surface 216 has a center on the Z axis. The second positioning surface 216 is further recessed towards the light emitting face 230 to define a substantially spheroid-shaped recess 24 at a center thereof.

An inner surface of the recess 24 functions as a light incident face 25 of the lens 20 for incidence of the light of the LED 10. The light incident face 25 is substantially spheroidal and has a central axis III coincident with the Z axis and the central axis I. The light incident face 25 is symmetrical relative to the plane YOZ along the lengthwise direction of the lens 20. The light incident face 25 is symmetrical relative to the plane ZOX along the widthwise direction of the lens 20. The light incident face 25 is further recessed towards the light emitting face 230 to form a spherical surface 250 at a right side of the plane ZOX, and the spherical surface 250 is symmetrical relative to the plane YOZ along the lengthwise direction of the lens 20. The light incident face 25 is intersected with the bottom of the lens 20 to form an elliptical contour line 252. A minor axis of the elliptical contour line 252 corresponds to the lengthwise direction of the lens 20. A major axis of the elliptical contour line 252 corresponds to the widthwise direction of the lens 20. A center of the elliptical contour line 252 is located in the Z axis.

The lens 20 is located over the LED 10. The substrate 11 is received in the second receiving groove 215. A top surface 111 of the substrate 11 abuts on the second positioning surface 216 of the second receiving groove 215. The flange 14 of the substrate 11 is received in the first receiving groove 213. A top surface 140 of the flange 14 abuts on the first positioning surface 214 of the first receiving groove 213. A bottom surface 141 of the flange 14 is coplanar with a bottom surface 210 of the supporting portion 21 of the lens 20. In this embodiment, the encapsulation unit 13 of the LED 10 is spaced from the light incident face 25 of the lens 20 thereby defining a gap therebetween when the LED 10 is assembled into the lens 20 to form the present LED module 1.

Figure 5:
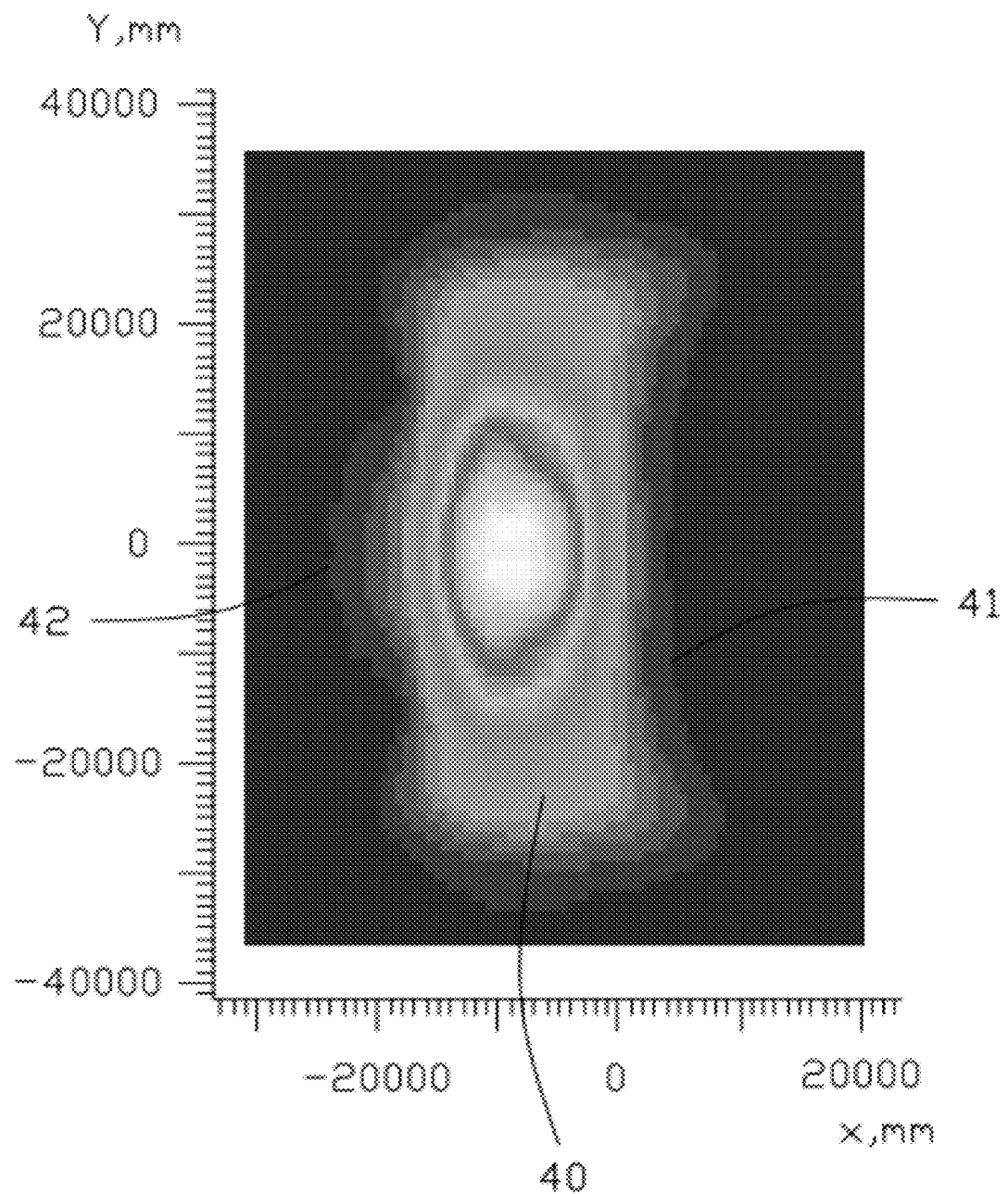
FIG. 5 is an isolux diagram of the LED module of FIG. 1.

FIG. 5 shows an illumination area 40 of the LED module 1. The illumination area 40 is elongated in profile. A center portion of a long right side 41 of the illumination area 40 is inwardly depressed towards a long left side 42 of the illumination area 40, and a center portion of the long left side 42 of the illumination area 40 is outwardly protruded.

Figure 6:
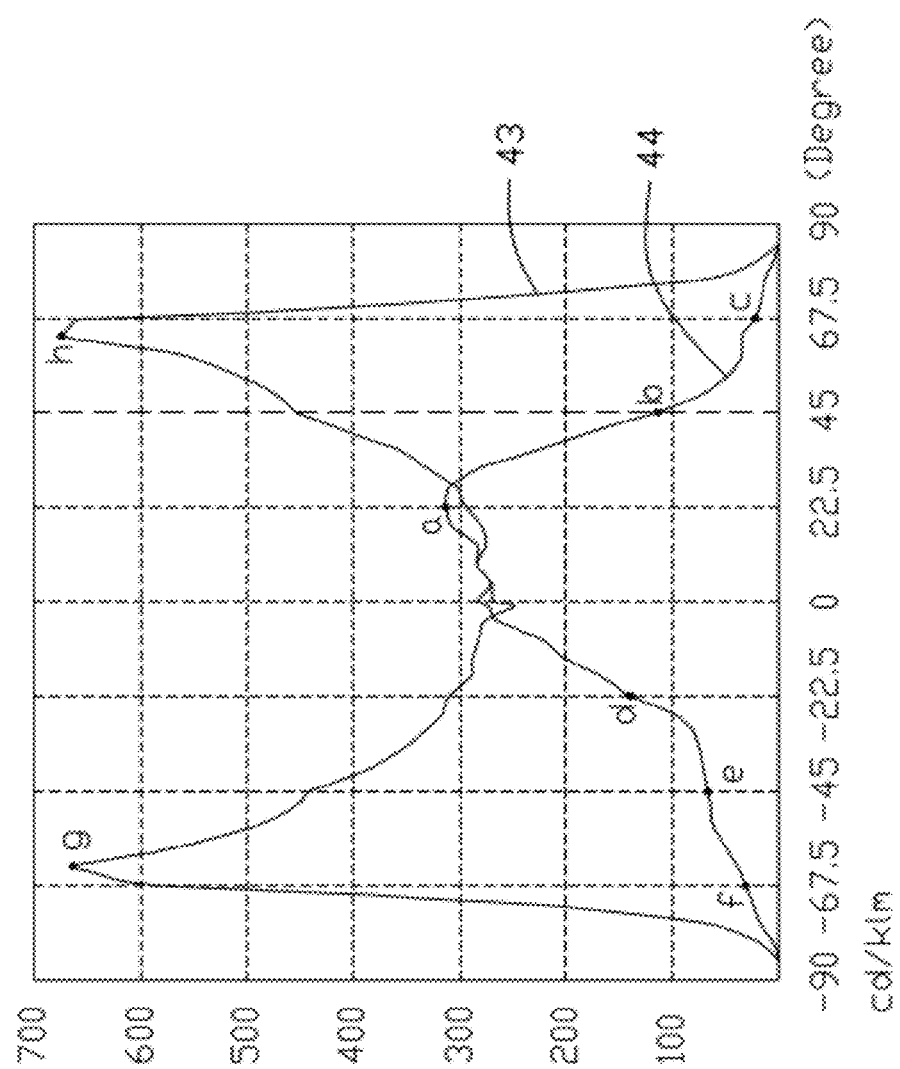
FIG. 6 is a graph of light intensities of the LED module of FIG. 1.

FIG. 6 shows a first solid curve 43 and a second solid curve 44, wherein the first solid curve 43 represents a light intensity of the present LED module 1 along the plane ZOX in various light radiating angles of the LED module 1, and the second solid curve 44 represents a light intensity of the present LED module 1 along the plane YOZ in various light radiating angles of the LED module 1.

Figure 4:
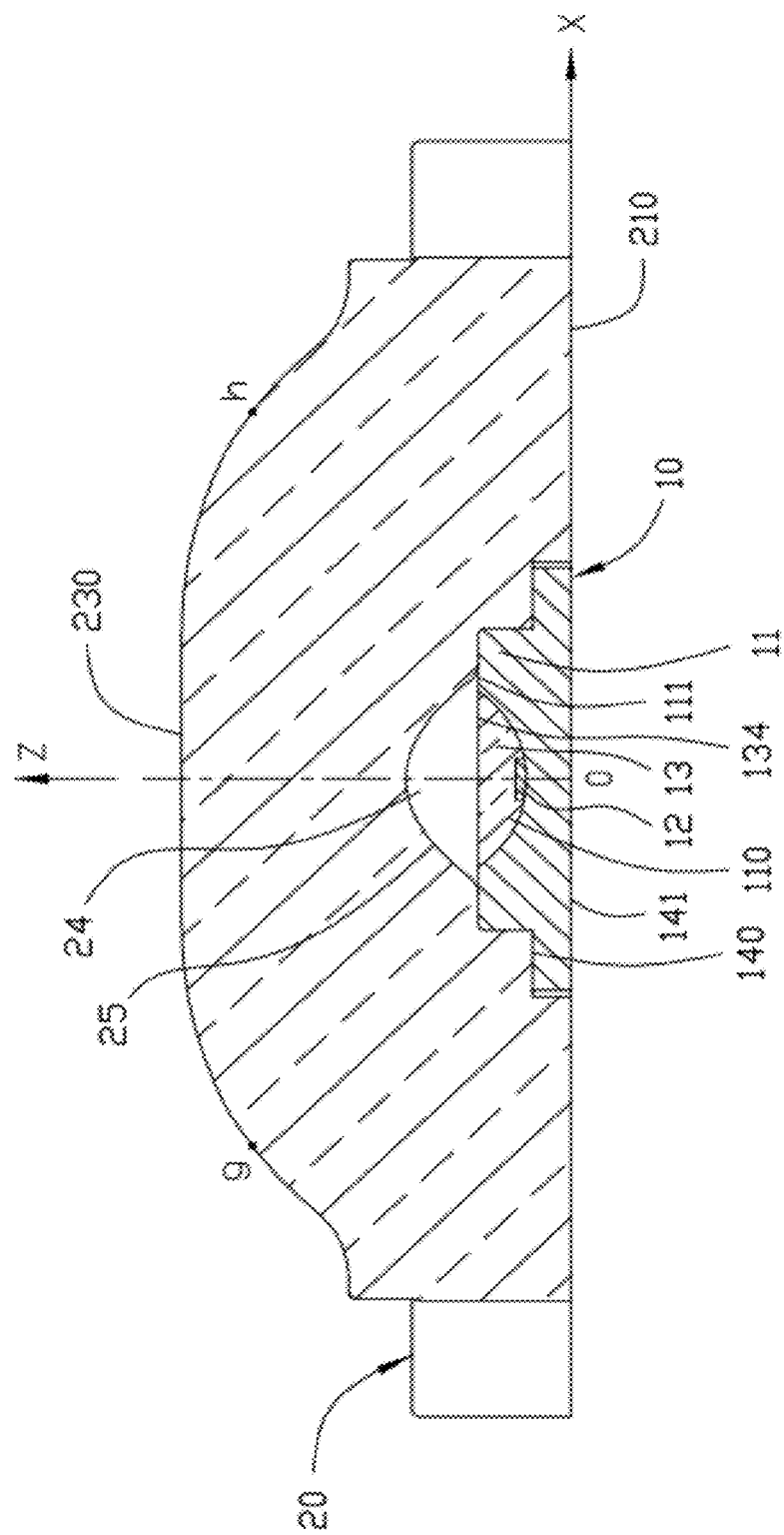
FIG. 4 is a cross-sectional view of the LED module of FIG. 1, taken along a line IV-IV thereof, which passes along the plane ZOX.

Referring to FIG. 4 and FIG. 6, since the lens 20 is symmetric to the plane YOZ along the lengthwise direction thereof, the light intensities at opposite sides of the plane YOZ are substantially identical to each other, as illustrated by the first solid line 43 of FIG. 6. At each side of the plane YOZ, with an increase of the light radiating angle between the light beam of the LED 10 and the central axis I of the LED 10, the light intensity of the LED module 1 increases from the central axis I to position g (h), and then decreases from the position g (h) towards an outer edge of the light emitting face 230 of the lens 20.

Figure 3:
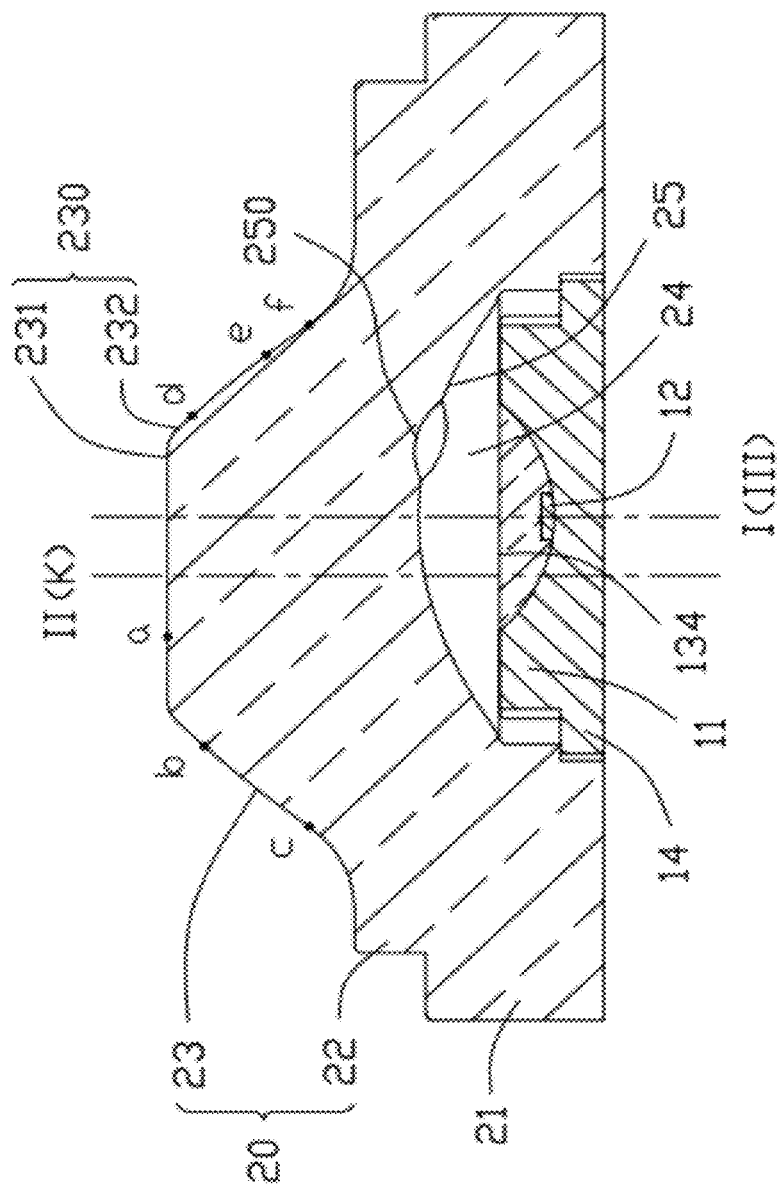
FIG. 3 is a cross-sectional view of the LED module of FIG. 1, taken along a line III-III thereof, which passes along the plane of YOZ.

Referring to FIG. 3 and FIG. 6, since the central axis II of the light emitting face 230 of the lens 20 offsets leftwards from the central axis I of the LED 10, most of the light emitted from the LED 10 is refracted out of the lens 20 and deflected leftwards. The light intensity of the LED module 1 in the left side of the central axis I of the LED 10 is much greater than that at the right side of the central axis I. That is, the light beams emitted out from the light emitting face 230 of the lens 20 at the left side of the plane ZOX are much stronger than the light beams emitted out from the light emitting face 230 of the lens 20 at the right side of the plane ZOX. At the left side of the plane ZOX, with an increase of the light radiating angle between the light beam of the LED 10 and the central axis I of the LED 10, the light intensity of the LED module 1 firstly increases from the central axis I to position a and then decreases from the position a to positions b and c. The peak light intensity of the LED module 1 occurs at the position a. At the right side of the plane ZOX, with an increase of the light radiating angle between the light beam of the LED 10 and the central axis I of the LED 10, the light intensity of the LED module 1 decreases from the central axis I to position d, and further decreases from the position d to positions e and f. In other words, the light intensity of the LED module 1 at the right side of the plane ZOX continuously decreases from the central axis I with an increase of the light radiating angle of the LED 10. The light intensity at the position e is about ⅓ of the peak light intensity at position a. The light radiating angle between the position a (d) and the central axis I of the LED 10 is about 22.5 degrees, the light radiating angle between the position b (e) and the central axis I of the LED 10 is about 45 degrees, and the light radiating angle between the position c (f) and the central axis I of the LED 10 is about 67.5 degrees.

Figure 7:
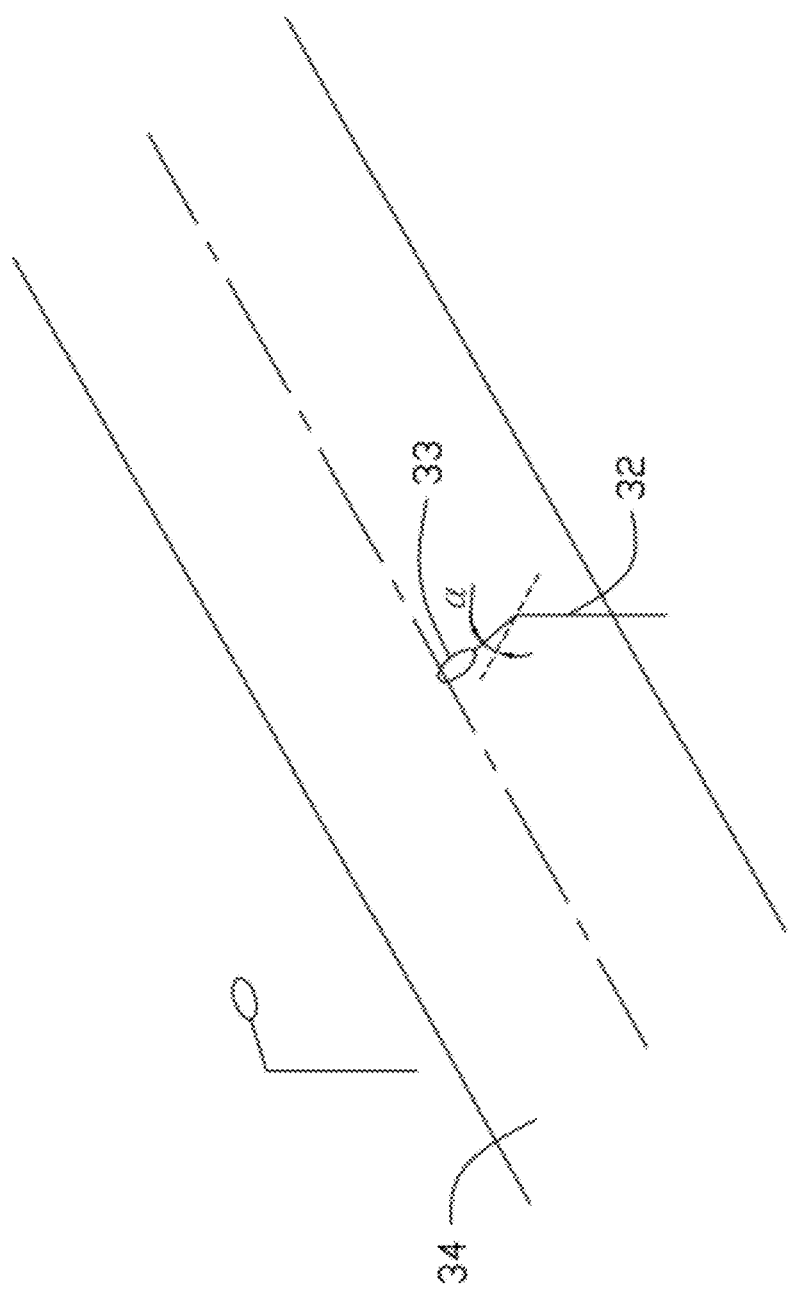
FIG. 7 is a schematic view with the LED module of FIG. 1 being utilized as a street lamp on a side of a road.

When the present LED module 1 is utilized as a street lamp 33 on a side of a road 34 as shown in FIG. 7, the LED module 1 is mounted in such a manner that the lengthwise direction of the LED module 1 coincides with a longitudinal direction of the road 34 while the widthwise direction of the LED module 1 coincides with a transverse direction of the road 34. The right side of the LED module 1 with the apertures 212 thereat is arranged facing a roadside of the road 34, while the left side of the LED module 1 without the apertures 212 thereat faces a center of the road 34. The light emitted from the LED 10 is refracted by the lens 20 to form the substantially elongated illumination area 40 along the longitudinal direction of the road 34. The light beams along the transverse direction of the road 34 are deflected from the roadside of the road 34 towards the center of the road 34.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad 34 general meaning of the terms in which the appended claims are expressed.

What is claimed is:

1. An LED module comprising:
    an LED having a central axis I;
    a lens covering the LED, the lens having an light incident face for incidence of the light of the LED and an opposite light emitting face for refracting the light of the LED out of the lens when the light extends through the lens; and
    a three dimensional coordinate system consisting of an X axis, a Y axis, a Z axis and an origin O, wherein the origin O is located in a center of the LED, the X axis extends from the origin O and corresponds to a lengthwise direction of the lens, the Y axis extends from the origin O and corresponds to a widthwise direction of the lens, the Z axis extends from the origin O and corresponds to a height direction of the lens, the central axis I is coincident with the Z axis;
    wherein the light emitting face of the lens has a central axis II, the central axis II is parallel to and offsets from the central axis I, and the central axis II is located at a side of a plane ZOX;
    wherein light beams emitted out from the light emitting face of the lens at the side of the plane ZOX through which the central axis II extends are stronger than light beams emitted out from the light emitting face of the lens at another side of the plane ZOX.

2. The LED module of claim 1, wherein the light emitting face comprises two ellipsoid surfaces and a combination curved surface located between and connecting the two ellipsoid surfaces.

3. The LED module of claim 2, wherein the combination curved surface extends along the lengthwise direction of the lens, a width of the combination curved surface of the light emitting face decreases from two ends to a middle thereof in the lengthwise direction of the lens, the two ellipsoid surfaces are arranged at two sides of the widthwise direction of the lens, and a width of each ellipsoid surface increases gradually from two ends to a middle thereof in the lengthwise direction of the lens.

4. The LED module of claim 1, wherein the light emitting face is symmetrical relative to a plane YOZ along the widthwise direction of the lens, the light emitting face is symmetrical relative to a plane K wherein the plane K extends through the central axis II and is parallel to the plane ZOX, and the plane K is located at the side of the plane ZOX through which the central axis II extends.

5. The LED module of claim 1, wherein the light incident face is substantially spheroidal surface in profile, the light incident face has a central axis III, the central axis III is coincident with the Z axis, the light incident face is symmetrical relative to a plane YOZ along the lengthwise direction of the lens, the light incident face is symmetrical relative to the plane ZOX along the widthwise direction of the lens.

6. The LED module of claim 1, wherein the central axis II of the light emitting face is located on a plane YOZ.

7. The LED module of claim 1, wherein the light incident face is further recessed towards the light emitting face to form a spherical surface at the another side of the plane ZOX, and the spherical surface is symmetrical relative to a plane YOZ along the lengthwise direction of the lens.

8. The LED module of claim 1, wherein the light emitting face is formed on a top of the lens, a recess is defined in a bottom of the lens, and the light incident face is formed on an inner surface of the recess.

9. The LED module of claim 8, wherein the LED comprises a substrate, an LED chip and an encapsulation unit, the LED chip is received in the substrate, the encapsulation unit encapsulates the LED chip, a top surface of the encapsulation unit forms a light emitting surface of the LED, and the light emitting surface of the LED is spaced from the light incident face of the lens thereby defining a gap therebetween.

10. The LED module of claim 9, wherein the light emitting surface of the LED is substantially planar in profile and coplanar with a top surface of the substrate.

11. The LED module of claim 9, wherein a bottom of the lens is recessed to define a first receiving groove thereby forming a first positioning surface in the first receiving groove, the first positioning surface is further recessed towards the light emitting face to define a second receiving groove thereby forming a second positioning surface in the second receiving groove, the second positioning surface is further recessed towards the light emitting face to define the recess, the substrate extends outwardly a flange at a bottom thereof, the substrate is received in the second receiving groove, a top surface of the substrate resists on the second positioning surface, the flange is received in the first receiving groove, and a top surface of the flange resists on the first positioning surface.

12. The LED module of claim 8, wherein the light incident face is intersected with the bottom of the lens to form an elliptical contour line, a minor axis of the elliptical contour line corresponds to the lengthwise direction of the lens, a major axis of the elliptical contour line corresponds to the widthwise direction of the lens, and a center of the elliptical contour line is located in the Z axis.

13. The LED module of claim 1, wherein the lens comprises a supporting portion at a bottom thereof, a light conductive portion at a top thereof and a connecting portion between the supporting portion and the light conductive portion, the light conductive portion bias away from one side of the connecting portion, and the light emitting face of the lens is formed on an outer surface of the light conductive portion.

14. The LED module of claim 1, wherein the lens is configured for making an illumination area of the LED module to be substantially elongated in profile, a center portion of one long side of the illumination area is inwardly depressed towards another long side of the illumination area, and a center portion of the another long side of the illumination area is outwardly protruded.

* * * * *

UNITED STATES PATENT AND TRADEMARK OFFICE
CERTIFICATE OF CORRECTION

| | | |
|---|---|---|
| PATENT NO. | : 8,272,767 B2 | Page 1 of 1 |
| APPLICATION NO. | : 12/608973 | |
| DATED | : September 25, 2012 | |
| INVENTOR(S) | : Chin-Chung Chen and Hai-Wei Zhang | |

It is certified that error appears in the above-identified patent and that said Letters Patent is hereby corrected as shown below:

On the title page, please insert Item (30) regarding "Foreign Application Priority Data" with the following:

-- (30)   Foreign Application Priority Data

Sept. 30, 2009   (CN) .....................200910308034.6 --

Signed and Sealed this
Twenty-ninth Day of October, 2013

Teresa Stanek Rea
*Deputy Director of the United States Patent and Trademark Office*